US006903362B2

(12) United States Patent
Wyeth et al.

(10) Patent No.: US 6,903,362 B2
(45) Date of Patent: Jun. 7, 2005

(54) PHASE CHANGE SWITCHES AND CIRCUITS COUPLING TO ELECTROMAGNETIC WAVES CONTAINING PHASE CHANGE SWITCHES

(75) Inventors: N. Convers Wyeth, Oakton, VA (US); Albert M. Green, Springfield, VA (US)

(73) Assignee: Science Applications International Corporation, San Diego, CA (US)

(*) Notice: Subject to any disclaimer, the term of this patent is extended or adjusted under 35 U.S.C. 154(b) by 0 days.

(21) Appl. No.: 10/797,036

(22) Filed: Mar. 11, 2004

(65) Prior Publication Data

US 2004/0183381 A1 Sep. 23, 2004

Related U.S. Application Data

(62) Division of application No. 09/851,619, filed on May 9, 2001, now Pat. No. 6,730,928.

(51) Int. Cl.[7] .......... H01L 29/04
(52) U.S. Cl. .......... 257/3; 438/128
(58) Field of Search .......... 257/3–5; 438/128, 438/659

(56) References Cited

U.S. PATENT DOCUMENTS 3,530,441 A 9/1970 Ovshinsky
3,918,032 A 11/1975 Nicolaides
4,092,060 A 5/1978 Nunoshita et al.
5,296,716 A * 3/1994 Ovshinsky et al. .......... 257/3
6,391,688 B1 5/2002 Gonzalez et al. .......... 438/128
2003/0072195 A1 * 4/2003 Mikolajick .......... 365/200

* cited by examiner

*Primary Examiner*—Lincoln Donovan
(74) *Attorney, Agent, or Firm*—Kilpatrick Stockton LLP

(57) ABSTRACT

A switch is used in circuits which interact with electromagnetic radiation. The switch includes a substrate for supporting components of the switch. A first conductive element on the substrate is provided for connecting to a first component of the circuit, and a second conductive element on the substrate serves to connect to a second component of the circuit. A switch element is made up of a switching material on the substrate and connects the first conductive element to the second conductive element. The switching material is a compound which exhibits a bi-stable phase behavior and is switchable between a first impedance state value and a second impedance state value upon the application of energy thereto. A circuit consisting of a plurality of conductive elements includes the switch for varying current flow which has been induced by the application of electromagnetic radiation.

15 Claims, 6 Drawing Sheets

PHASE CHANGE SWITCHES AND CIRCUITS COUPLING TO ELECTROMAGNETIC WAVES CONTAINING PHASE CHANGE SWITCHES

CROSS-REFERENCE TO RELATED APPLICATIONS

This application is a divisional application of and claims priority to U.S. Utility patent application Ser. No. 09/851,619, filed May 9, 2001 now U.S. Pat. No. 6,730,928, entitled, "PHASE CHANGE SWITCHES AND CIRCUITS COUPLING TO ELECTROMAGNETIC WAVES CONTAINING PHASE CHANGE SWITCHES," which is herein incorporated by reference in its entirety.

BACKGROUND OF THE INVENTION

1. Field of the Invention

The invention relates to phase change switches, and more particularly, to phase change switches having a dynamic range of impedance. More specifically, the invention relates to such switches which can be employed in circuits such as on frequency selective surface arrays, for controlling current flow throughout the array, through the use of the switches. By controlling such current flow, the properties of the frequency selective surface array can be actively controlled.

2. Background of the Invention

A two-dimensional periodic array of patch or aperture elements is called a frequency selective surface (FSS) because of the frequency selective transmission and reflection properties of the structure. In the past, many FSS applications and sophisticated analytical techniques have emerged. Applications include multi-band FSS, reflector antennas, phased array antennas, and bandpass radomes.

More recently, capabilities of the FSS have been extended by the addition of active devices embedded into the unit cell of the periodic structure. Such structures are generally known as active grid arrays.

Active grid arrays have been developed in which a variable impedance element is incorporated to provide an FSS whose characteristics are externally controllable. However, such applications involve complex structures that can be difficult to manufacture and control.

Mechanical on/off switches have been used in circuits designed to interact with electromagnetic waves. The mechanical process in these on/off switches involves the physical motion of a conductor between two positions, i.e., one where the bridge touches another conductor and completes the conducting path of the circuit, and the other where it has moved away from the contact to break the circuit paths. Such mechanical switches have been made at micrometer size scale. The capacitances between the two switch conductors in the open or "off" position must be lowered to a level that effectively breaks the circuit for alternating electromagnetic current flow.

Alternatively, transistor and transistor-like semiconductor switching devices have been used in circuits designed to interact with electromagnetic waves. However, for the specific applications herein, conventional semiconductor switching devices typically will not operate to open and close circuits effectively to electromagnetic current flow in the frequency range of terahertz and above because at these frequencies, various intrinsic capacitances in the device structure can provide low impedance circuit paths that prevent the switch from operating as intended.

In the field of semiconductor memory devices, it has been proposed to use a reversible structural phase change (from amorphous to crystalline phase) thin-film chalcogenide alloy material as a data storage mechanism. A small volume of alloy in each memory cell acts as a fast programmable resistor, switching between high and low resistance states. The phase state of the alloy material is switched by application of a current pulse. The cell is bi-stable, i.e., it remains (with no application of signal or energy required) in the last state into which it was switched until the next current pulse of sufficient magnitude is applied.

SUMMARY OF THE INVENTION

In accordance with one aspect of the invention there is provided a switch for use in circuits that interact with electromagnetic radiation. The switch includes a substrate for supporting components of the switch. A first conductive element is on the substrate for connection to a first component of the circuit, and a second conductive element is also provided on the substrate for connection to a second component of the circuit.

A switch element made up of a switching material is provided on the substrate, and connects the first conductive element to the second conductive element. The switching material is made up of a compound which exhibits bi-stable phase behavior, and is switchable between a first impedance state value and a second impedance state value by application of energy thereto, typically electrical current flow, for affecting or controlling current flow between the first conductive element and the second conductive element, resulting from a change in the impedance value of the compound. By bi-stable phase behavior is meant that the compound is stable in either the amorphous or the crystalline phase at ambient conditions and will remain in that state with no additional application of energy.

In a more specific aspect, the switching material comprises a chalcogenide alloy, more specifically, $Ge_{22}Sb_{22}Te_{56}$. Preferably, it is a reversible phase change material having a variable impedance over a specified range which is dependent upon the amount of energy applied to the material.

In another aspect, there is provided a circuit for coupling to electromagnetic waves by having current flow induced throughout the circuit. The circuit includes at least one switch of the type previously described.

More specifically, the circuit is a grid of a plurality of the first and second conductive elements that are spatially aligned to form the circuit as a frequency selective surface array. A plurality of the switch elements may be interconnected throughout the circuit for varying current flow induced in the circuit by impinging electromagnetic radiation.

In another aspect, the first and second conductive elements in the grid forming the frequency selective surface are also made of the same compound as the switching material. In this aspect, the conductive elements and the connecting element may be switched together between low and high impedance states. More specifically, the circuit may be configured to cause only the connecting element to change its phase when an amount of energy is applied to the circuit. In this case, the first and second conductive elements, although made of the same compound, remain in the low impedance state.

BRIEF DESCRIPTION OF THE DRAWINGS

Having thus briefly described the invention, the same will become better understood from the following detailed discussion, made with reference to the appended drawings wherein.

DETAILED DESCRIPTION OF THE INVENTION

Figure 1:
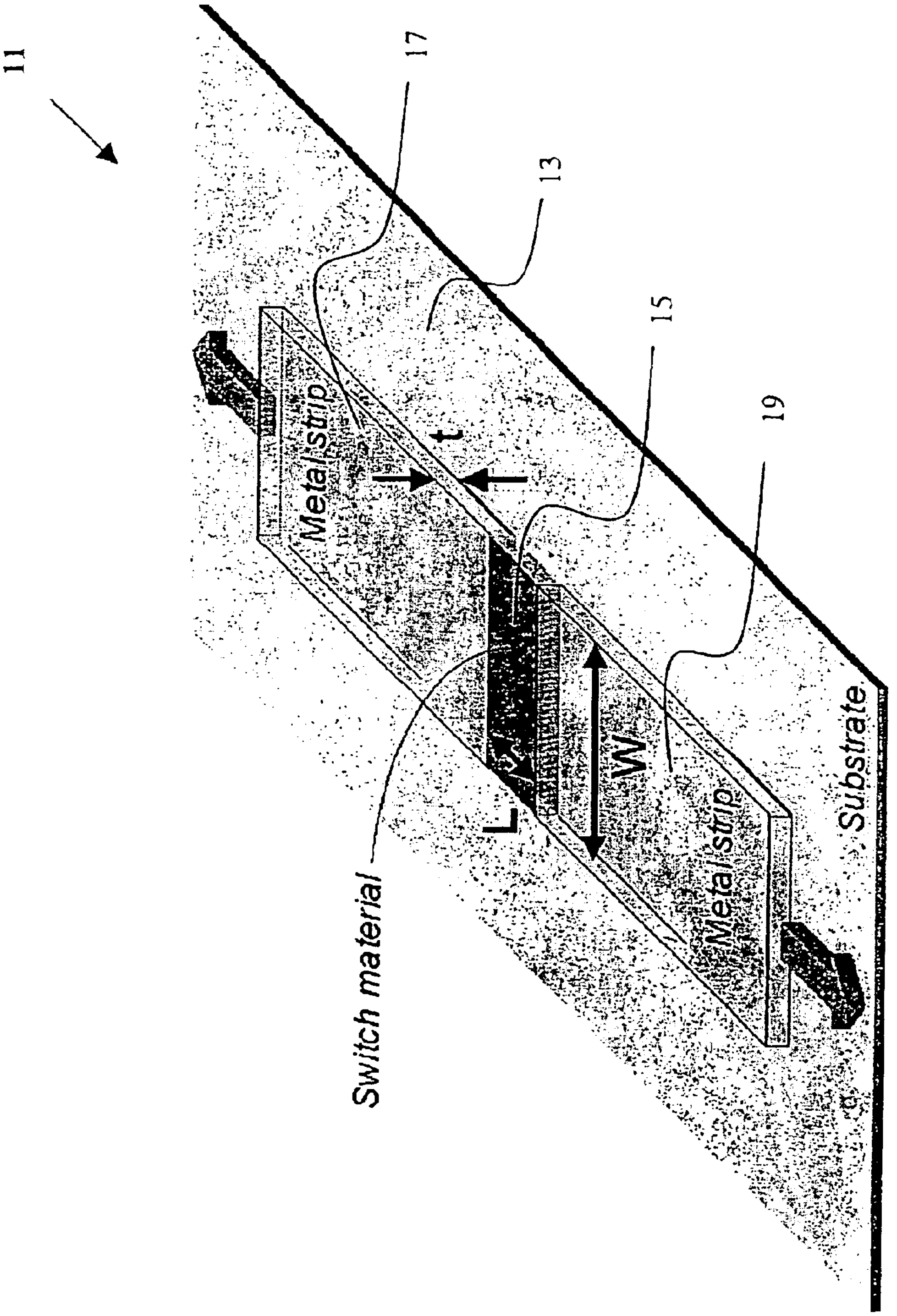
FIG. 1 is a schematic view of the switch between two conductive elements as described herein.

FIG. 1 schematically illustrates a switch 11 in accordance with the invention. The switch includes a substrate 13 having a switch material 15 deposited thereon to form a switch element, and connecting a first conductive element 17, typically a metal strip, to a second conductive element 19. The conductive elements 17 and 19 can be, for example, two circuit paths of an array or circuit such as a frequency selective surface array. The entire array can sit on top of a dielectric substrate 13, such as polyethylene.

The switch material 15 is typically a reversible phase change thin film material having a dynamic range of resistivity or impedance. An example of a typical switch material for use in accordance with the invention is a chalcogenide alloy, more specifically, $Ge_{22}Sb_{22}Te_{56}$. Although a specific alloy has been described, it will be readily apparent to those of ordinary skill in the art that other equivalent alloys providing the same functionality may be employed Other such phase change alloys include the Ag—In—Sb—Te (AIST), Ge—In—Sb—Te (GIST), (GeSn)SbTe, GeSb(SeTe), and $Te_{51}Ge_{15}Sb_2S_2$ quaternary systems; the ternaries $Ge_2Sb_2Te_5$, InSbTe, GaSeTe, $SnSb_2Te_4$, and InSbGe; and the binaries GaSb, InSb, InSe, $Sb_2Te_3$, and GeTe. As already noted, several of these alloys are in commercial use in optical data storage disk products such as CD-RW, DVD-RW, PD, and DVD-RAM. However, there has been no use or suggestion of use of such an alloy as a switch element in applications such as described herein. Typically, the alloy is deposited by evaporation or sputtering in a layer that is typically 20–30 nm thick to a tolerance of ±1 nm or less as part of a large volume, conventional, and well known to those of ordinary skill in the art, manufacturing process.

Figure 6:
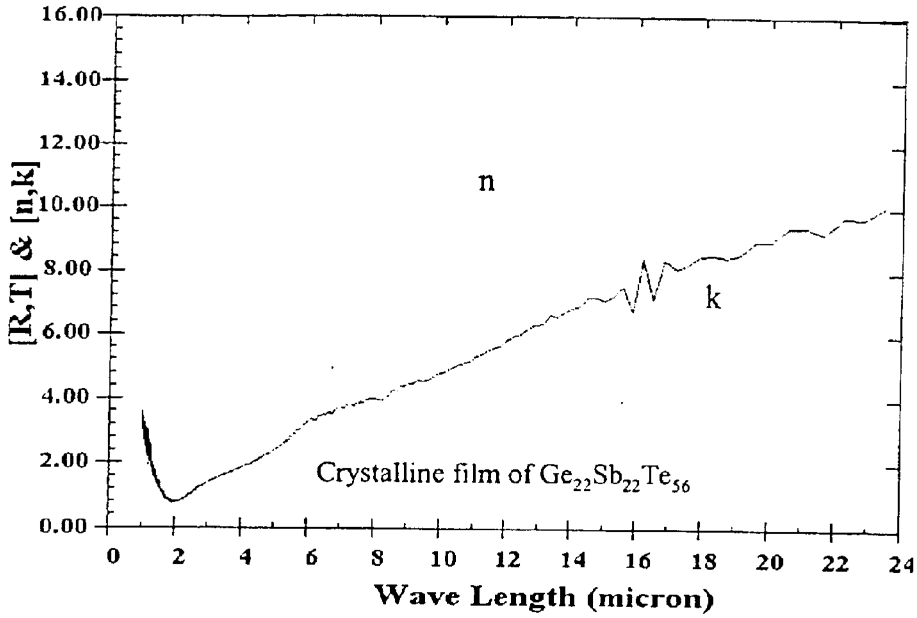
FIGS. 6 and 7 are graphs illustrating measured values of the complex index of refraction of an alloy used in the switch, in the infrared for the crystalline phase, and the amorphous phase.
Figure 7:
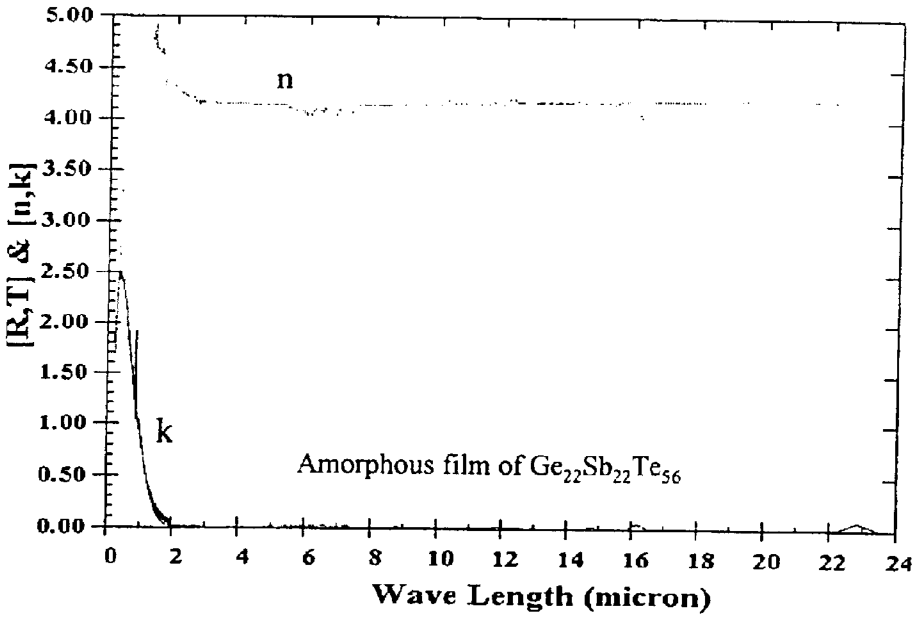

In this regard, with reference to the specific alloy discussed, FIGS. 6 and 7 illustrate measured values of the complex index of refraction of $Ge_{22}Sb_{22}Te_{56}$ over a spectral wavelength range that includes 8–12 μm. At the mid-band wavelength of 10 μm, the real index, n, changes by a factor of 2 between the two phases, but the so-called extinction coefficient, k, goes from approximately 4.8 in the crystalline phase to near zero in the amorphous phase.

Accordingly, the following table shows calculations using this data to find the changes in resistivity (ρ) and dielectric constant (∈) of the material.

Optical and Electrical Properties of the alloy $Ge_{22}Sb_{22}Te_{56}$ at IR vacuum wavelength of 10 μm.

| Phase => | Crystalline | Amorphous |
|---|---|---|
| n | | 4.2 |
| k | 4.8 | 0.01 |
| f (frequency in Hz) | $3 \times 10^{13}$ | $3 \times 10^{13}$ |
| $\rho \propto (nkf)^{-1}$ (ohm-cm) | $7.6 \times 10^{-4}$ | 0.71 |
| $\epsilon = n^2 - k^2$ | 44.2 | 17.6 |

As the table shows, the change in k correlates with a change in resistivity of almost three orders of magnitude.

In order to determine the thermal IR (infrared) performance, the shunt is modeled as a capacitor and a resistor in parallel. The following table shows the calculated values for the capacitive and resistive impedance components with switch dimensions in the expected fabrication range, using the expressions shown in the table.

Resistance (R) and capacitive reactance ($X_C$) components of the switch impedance in the crystalline and amorphous states for several representative values of the switch dimensions shown in FIG. 1. The capacitive reactance values are calculated using $\omega = 1.9 \times 10^{14}$ Hz, which corresponds to f = 30 THz or $\lambda$ = 10 μm.

| | | | Crystalline | | Amorphous | |
|---|---|---|---|---|---|---|
| L (μm) | W (μm) | t (μm) | $X_C = (\omega C)^{-1}$ with $C = \epsilon Wt/L$ (ohms) | $R = \rho L/Wt$ (ohms) | $X_C = (\omega C)^{-1}$ with $C = \epsilon Wt/L$ (ohms) | $R = \rho L/Wt$ (ohms) |
| 1.0 | 1.0 | 0.01 | 1.36K | 1K | 3.4K | 1M |
| 1.0 | 1.0 | 0.1 | 136 | 100 | 340 | 100K |
| 1.0 | 1.0 | 0.2 | 68 | 50 | 170 | 50K |
| 1.0 | 0.5 | 0.1 | 271 | 200 | 680 | 200K |

Figure 8:
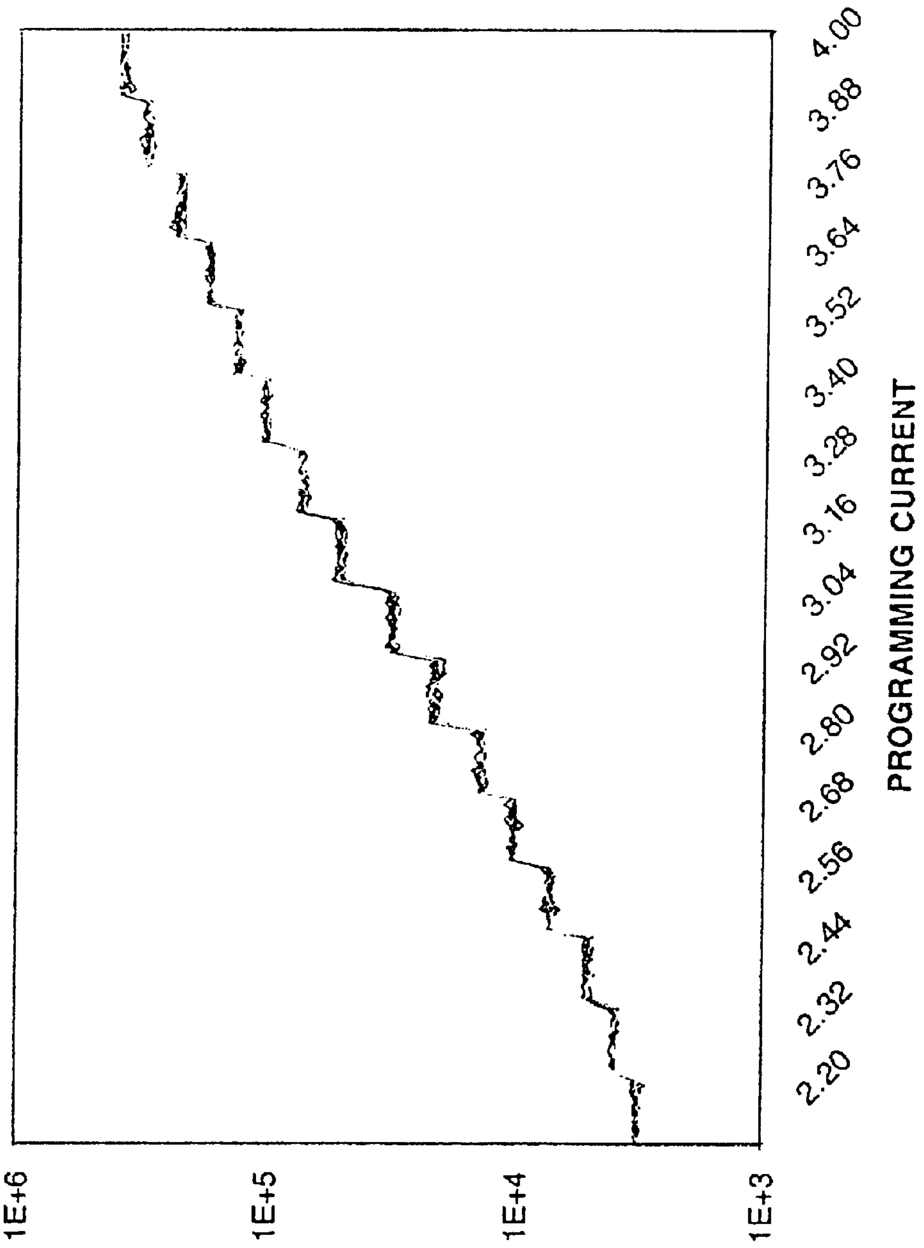
FIG. 8 is a graph illustrating how the resistance of the phase change alloy can be continuously varied to provide reflectivity/transmissivity control in a circuit.

As further shown in FIG. 8, the resistance of the specific alloy discussed herein can therefore be continuously varied to provide reflectivity control.

Figure 2:
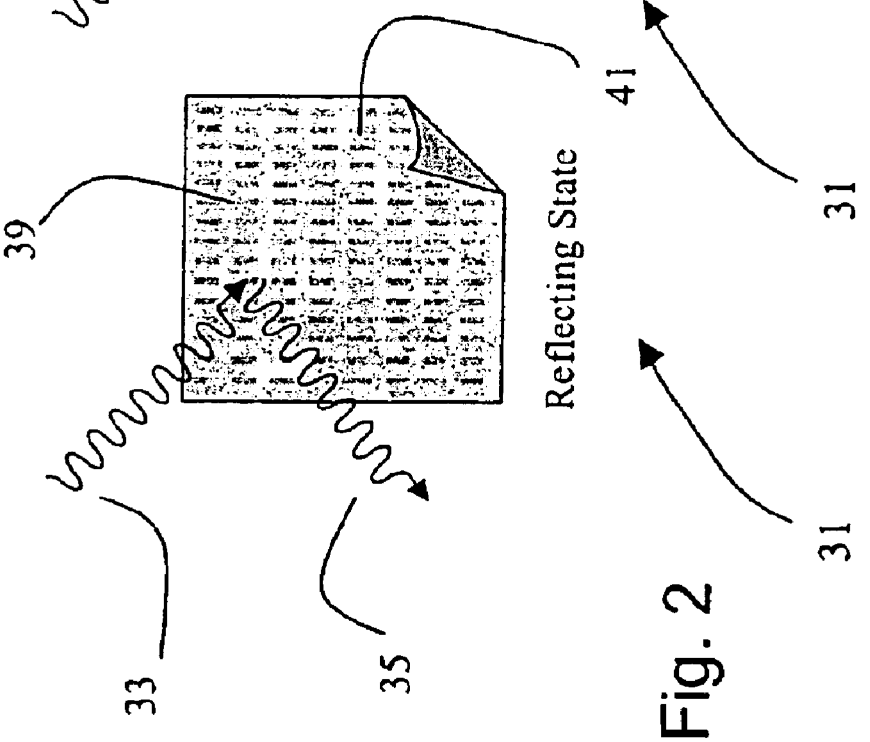
FIGS. 2 and 3 are schematic views of a frequency selective surface array shown, respectively, in a reflecting state and in a non-reflecting state, depending on the impedance value of switches disposed throughout the array.
Figure 3:
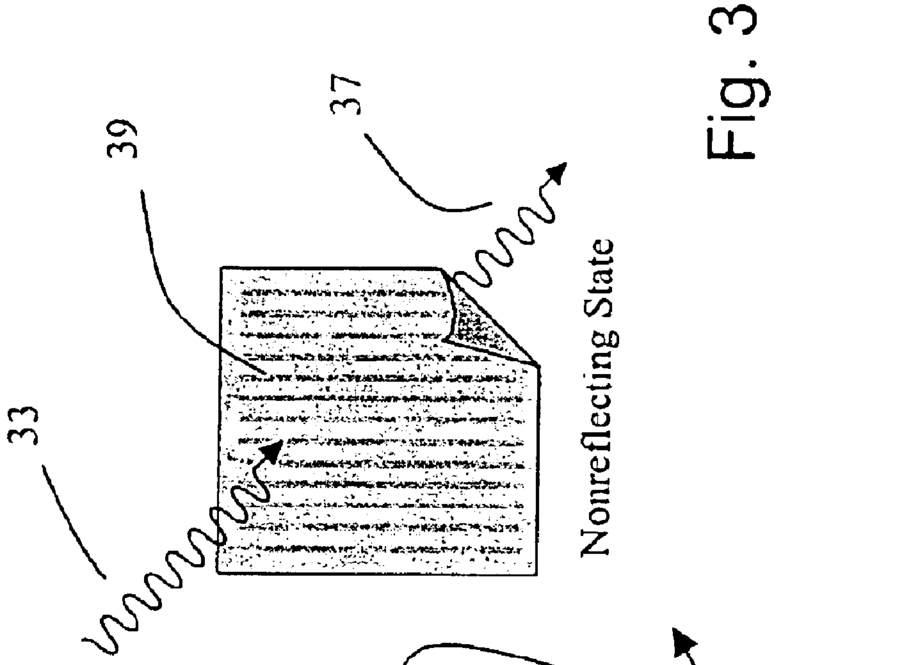

FIGS. 2 and 3 thus show the effect on an array of the use of switches 11. This is shown, for example, in a frequency selective surface array 31. In the case of FIG. 2, the array includes a plurality of conductors 39 having switches 41 as described herein interconnected therebetween. In the case of FIG. 2, the switches are in a high impedance state, thereby interrupting the conductive paths such that electromagnetic radiation 33 impinging on the array then becomes reflected radiation 35. Conversely, FIG. 3 shows the array with the switches at a low impedance such that the conductors 39 are continuous, and the impinging radiation 33 passes through the array 31 as transmitted radiation 37.

Figure 4:
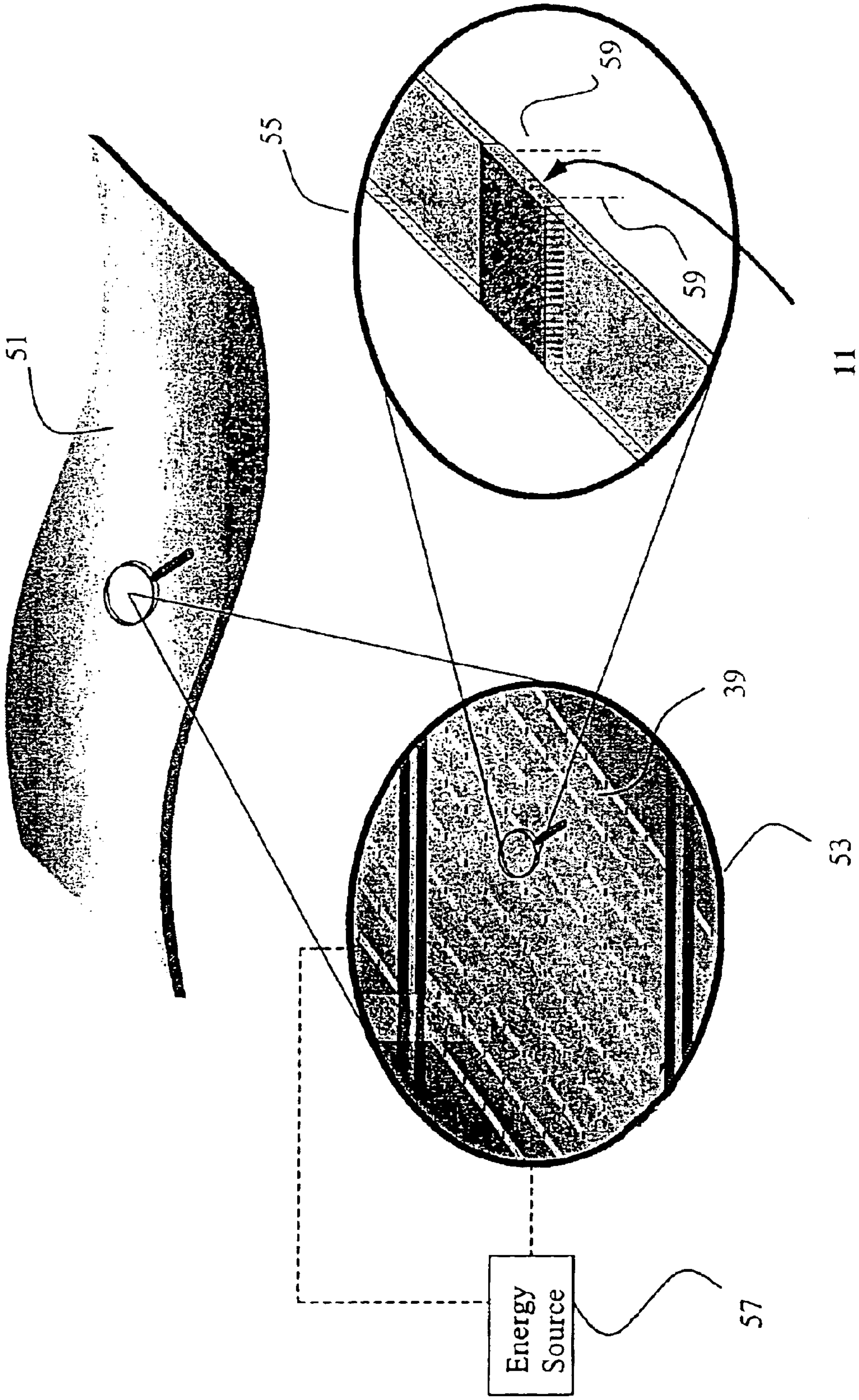
FIG. 4 shows three views of increasing magnification of an array, with conductive elements and switches arranged therein, and with a further magnified view of a typical switch element.

FIG. 4 illustrates in greater detail a typical circuit 51, which as illustrated in the intermediate magnification 53, includes a plurality of conductors 39 having the switches shown as dots interconnected therebetween. In order to vary the impedance of the switches, an energy source 57 may be connected to the individual conductors to provide current flow to the switches 11 to thereby change the impedance of the switches 11 by the application of energy, in the form of electricity. As further shown in the third magnification 55, while the conductors 39 themselves can be directly connected to an energy source, it is also possible to selectively establish leads 59 to the switch material 15 to apply energy to the switch material directly and not through the conductors 39 to cause the impedance to vary.

Figure 5:
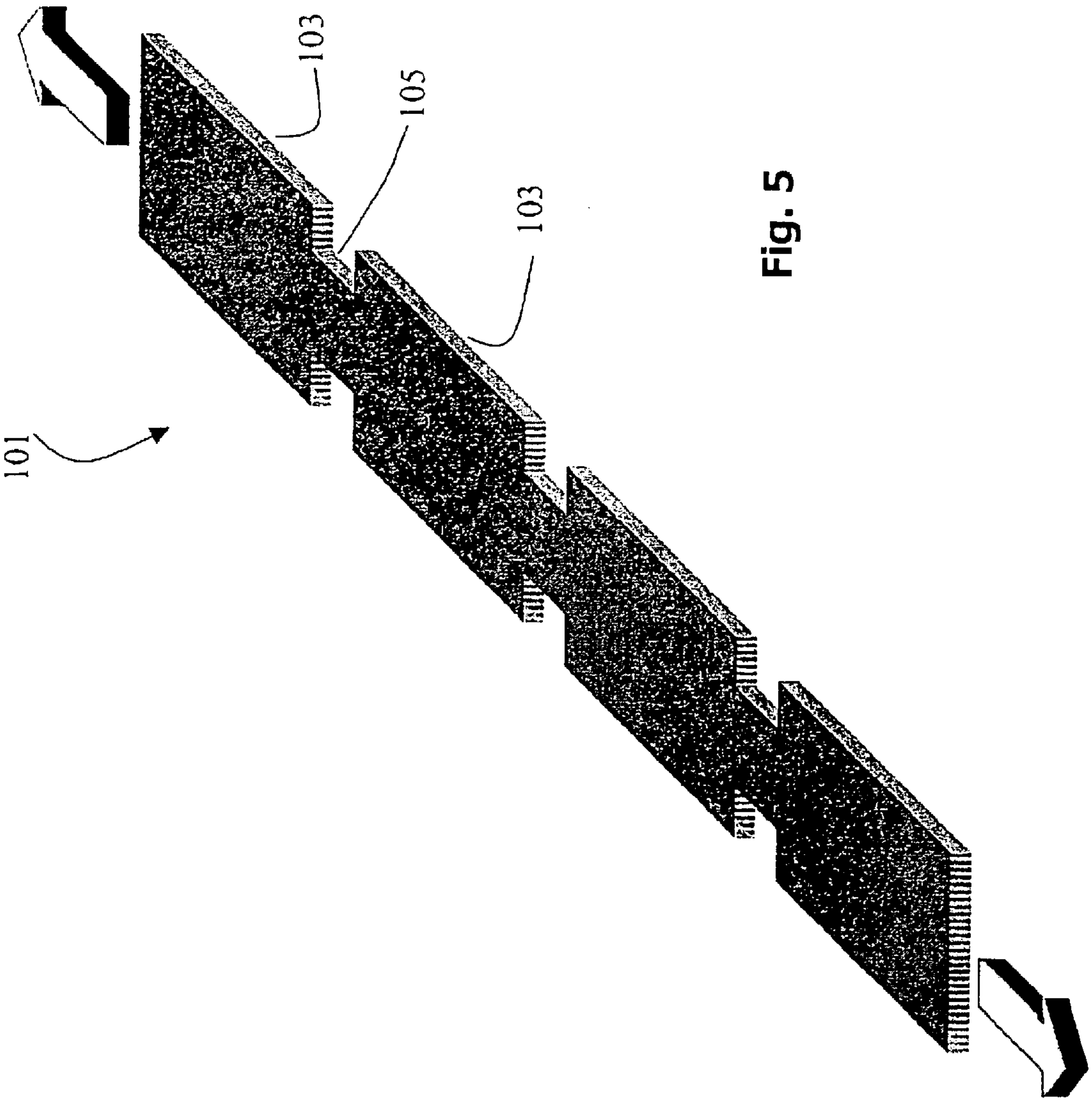
FIG. 5 is a schematic view of a circuit element similar to that of FIG. 1, for use in a switching frequency selective surface array (as in FIGS. 2, 3, and 4), where the entire element is made of switchable material but configured so that only the connecting elements change state upon application of electrical energy.

FIG. 5 shows in detail an additional embodiment 101 of the invention in which conductive elements 103 and the connecting switch 105 are entirely made of the same phase change material to form the switch element as compared to the embodiment of FIG. 1. In this embodiment, the switch 105 is purposely made less wide to form a switch element which is narrower than the conductive elements 103 that connect to it on either side, but having a thickness equal to the conductive elements 103. In this case, the cross section of the switch element is less than the cross section of the conductive elements 103, causing the electrical resistance per unit length to be greater in the switch element than in the conducting elements. When electrical current is passed through a circuit made up of a series of these constricted switch connections, i.e., switches 105, the phase change material in the switches 105 will dissipate more electrical energy per unit length than the conducting elements because of the higher resistance per unit length. This higher dissipation will cause the switches 105 to experience a greater temperature rise than the conductive elements 103. Therefore a correctly sized electrical current pulse will cause the phase change material in the switches 105 to change state while the phase change material in the conductive elements 103 remains in the low impedance state. As is the case with the earlier described embodiment as shown in FIG. 4, the leads 59 (not shown) can also be established to connect to the switches 105 to apply energy directly to the switch 105, and not through the conductive elements 103.

While in a specific embodiment the impedance of the phase change material of switches is varied by application of electrical current to change the state of the phase change material, it will be appreciated by those of ordinary skill in the art that given the nature of the material, other energy sources can be employed. For example, selectively targeted laser beams may be directed at the switches to change the overall circuit current flow configuration, as well as other alternative means of providing energy to change the state and thus vary the impedance can be used.

Having thus described the invention in detail, the same will become better understood from the appended claims in which it is set forth in a non-limiting manner.

What is claimed is:

1. A switch for use in circuits which interact with electromagnetic radiation, comprising:

at least one switch comprised of:

a substrate for supporting components of the switch, a first conductive element on said substrate for connection to a first component of said circuit, a second conductive element on said substrate for connection to a second component of said circuit, and a switch element made up of a switching material on said substrate, and connecting the first conductive element to the second conductive element, said switching material comprised of a compound which exhibits a bi-stable phase behavior, and switchable between a first impedance state value and a second impedance state value by application of energy thereto, affecting current flow between said first conductive element and said second conductive element resulting from a change in the impedance value of said compound, such that electromagnetic energy flowing in the first and second conductive elements resulting from electromagnetic radiation interacting with the circuit containing the switch is either reflected off of the switch or transmitted through the switch depending on the impedance value.

2. The switch of claim 1, wherein said first and second impedance state value, are such that at one value the switch is conductive, and at the other value the switch is from less conductive to being non-conductive.

3. The switch of claim 1, further comprising an energy source connected to the switch for causing said change in impedance values.

4. The switch of claim 1, further comprising separate leads connected to said switch for connection to an energy source.

5. The switch of claim 4, further comprising an energy source connected to the switch through said leads for causing said change in impedance values.

6. The switch of claim 1, wherein said first conductive element and said second conductive elements are part of a circuit for coupling with electromagnetic waves which induce current flow in at least one of said first conductive element and said second conductive element.

7. The switch of claim 1, wherein said switching material comprises chalcogenide alloy.

8. The switch of claim 7 wherein said alloy comprises $Ge_{22}Sb_{22}Te_{56}$.

9. The switch of claim 1, wherein said switching material is a thin film material.

10. The switch of claim 1, wherein said switching material is a reversible phase change material having a variable impedance over a specified range which is dependent on the amount of energy applied to the material.

11. The switch of claim 1, wherein said fist and second conductive elements are the same material as said switching material.

12. A switch for use in circuits which interact with electromagnetic radiation, comprising:

at least one switch comprised of;

a substrate for supporting components of the switch;

a first conductive element on said substrate for connection to a first component of said circuit, a second conductive element on said substrate for connection to a second component of said circuit, and a switch element made up of a switching material on said substrate, and connecting the first conductive element to the second conductive element, said switching material comprised of a compound which exhibits a bi-stable phase behavior, and switchable between a first impedance state value and a second impedance state value by applicator of energy thereto, affecting current flow between said first conductive element and said second conductive element resulting from a change in the impedance value of said compound, wherein said first and second conductive elements are the same material as said switching material and said switch element is shaped to switch its phase state to the second impedance state in response to an application of energy to said switch while said conducting elements remain in said first impedance state, and remains in the second impedance state without continuing the application of energy.

13. The switch of claim 12, wherein the switch element is narrower than the first and second conductive elements.

14. The switch of claim 12, further comprising separate leads connected to said switch for causing said change in impedance values.

15. The switch of claim 1, wherein said switch element is shaped to switch its phase state to the second impedance state in response to an application of energy to said switch, and remains in the second impedance state without continuing the application of energy.

* * * * *

UNITED STATES PATENT AND TRADEMARK OFFICE

CERTIFICATE OF CORRECTION

PATENT NO. : 6,903,362 B2
APPLICATION NO. : 10/797036
DATED : June 7, 2005
INVENTOR(S) : N. Convers Wyeth and Albert M. Green It is certified that error appears in the above-identified patent and that said Letters Patent is hereby corrected as shown below:

Column 6:
In Claim 2, line 2, please change “impedance state value, are such that at one value the switch” to -- impedance state values are such that at one value the switch --.

In Claim 12, line 15, please change “value by applicator of energy thereto, affecting current” to -- value by application of energy thereto, affecting current --.

Signed and Sealed this

Twenty-ninth Day of January, 2008

JON W. DUDAS
*Director of the United States Patent and Trademark Office*